(12) United States Patent
Anshumali et al.

(10) Patent No.: US 7,436,220 B2
(45) Date of Patent: Oct. 14, 2008

(54) PARTIALLY GATED MUX-LATCH KEEPER

(75) Inventors: Kumar A Anshumali, Portland, OR (US); Tom Fletcher, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 274 days.

(21) Appl. No.: 11/394,545

(22) Filed: Mar. 31, 2006

(65) Prior Publication Data

US 2007/0240094 A1   Oct. 11, 2007

(51) Int. Cl.
*H03K 19/20* (2006.01)

(52) U.S. Cl. .......................................... 326/113; 326/93
(58) Field of Classification Search ............. 326/93–98, 326/112, 113, 191, 121
See application file for complete search history.

(56) References Cited

U.S. PATENT DOCUMENTS 5,629,636 A * 5/1997 Ahrens ........................ 326/39
6,320,421 B1 * 11/2001 Akita et al. ................. 326/113

* cited by examiner

*Primary Examiner*—Don P Le
(74) *Attorney, Agent, or Firm*—Lee & Hayes, PLLC

(57) ABSTRACT

Embodiments related to multiplexer latches (mux-latches) are presented herein.

18 Claims, 5 Drawing Sheets

PARTIALLY GATED MUX-LATCH KEEPER

BACKGROUND

Generally speaking, computer systems include one or more central processor units (CPUs). Each CPU includes many signal paths that convey data between functional units that operate on that data. Such data is typically conveyed using a transfer cycle having a specified timing structure. That timing structure dictates a time period when the data to be transferred will be valid. Accordingly, the data is captured while it is valid and held for a specified amount of time. Such data capture can be performed using a number of level sensitive latches. Within a CPU, level sensitive latches are commonly implemented using a circuit that includes cross coupled inverters.

Logic circuits are often connected to the input or output terminals of level sensitive latches such that a logic function is performed on the logic levels developed thereby. For example, logic circuits are typically connected to the output terminals of level sensitive latches to implement set and reset functions.

One such logic circuit is a multiplexer circuit. The combination of a multiplexer and level sensitive latches is generally referred to as a multiplexer latch (mux-latch). A mux-latch senses the logic levels of data signals that are connected to its input terminals. A number of clock signals are connected to the mux-latch that indicate which of those input data signals is to have its logic level latched at the output thereof.

FIG. 1 illustrates a conventional mux-latch 100. The mux-latch 100 includes four inverters 102, 104, 106 and 108 and a keeper 110. The mux-latch 100 further includes two pass-gates 112 and 114 and an inverter 116 realized in CMOS technology. As those skilled in the art appreciate, an output of the inverter 116 is equal to $V_{cc}$ when the p-device is "on" and the n-device is "off".

The passgates 112 and 114 of the mux-latch 100 are each comprised of a p-device in parallel with an n-device. Therefore, the passgates 112 and 114 will be "on", if an output from the inverters 102 and 106, respectively, is at a logic low level (0). The keeper 110 includes an inverter 118 and another inverter 120. The keeper 110 provides a weak output signal that maintains a signal output from the mux-latch. The keeper 110 maintains the output signal when clock signals CLKA and CLKB are at a logic low level (0). However, the keeper 110 is overridden when either of the passgates 112 or 114 is "on".

The conventional keeper 110 illustrated in FIG. 1 is implemented with long channel devices. The use of these long channel devices increases the area and power consumption of the mux-latch 100. Furthermore, the use of the long channel devices decreases the speed of the mux-latch 100.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical items.

DETAILED DESCRIPTION

Multiplexer latches (mux-latches) can be found in many different integrated circuits (ICs). Such ICs include memories, processors, and the like. Mux-latches, along with other complementary components, often handle intra-device communications associated with ICs.

The following disclosure is organized to describe initially various mux-latch implementations. This description is followed by a discussion of procedures related to the described mux-latches. Finally, an exemplary implementation of a computing device that is operable to employ one or more mux-latches is described.

Partially-Gated Mux-Latch Keeper

Figure 1:
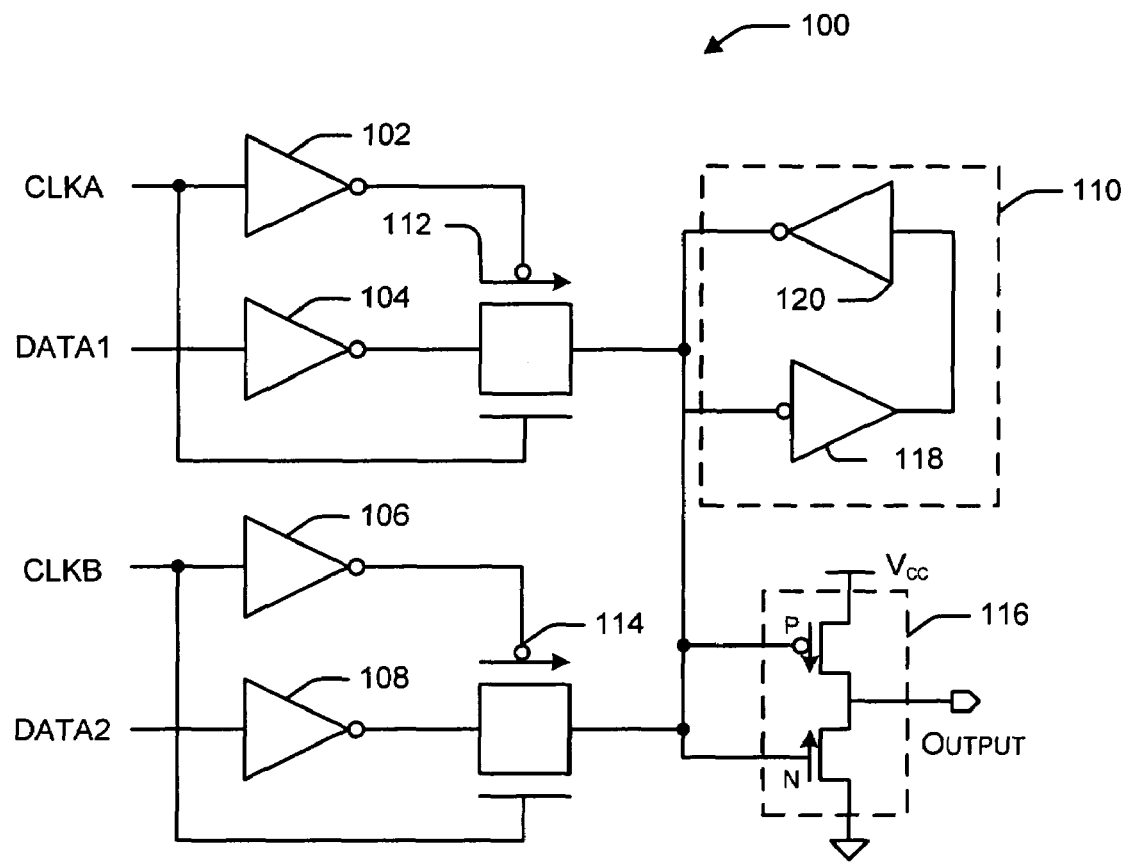
FIG. 1 is a circuit diagram illustrating a conventional multiplexer latch (mux-latch) circuit.
Figure 2:
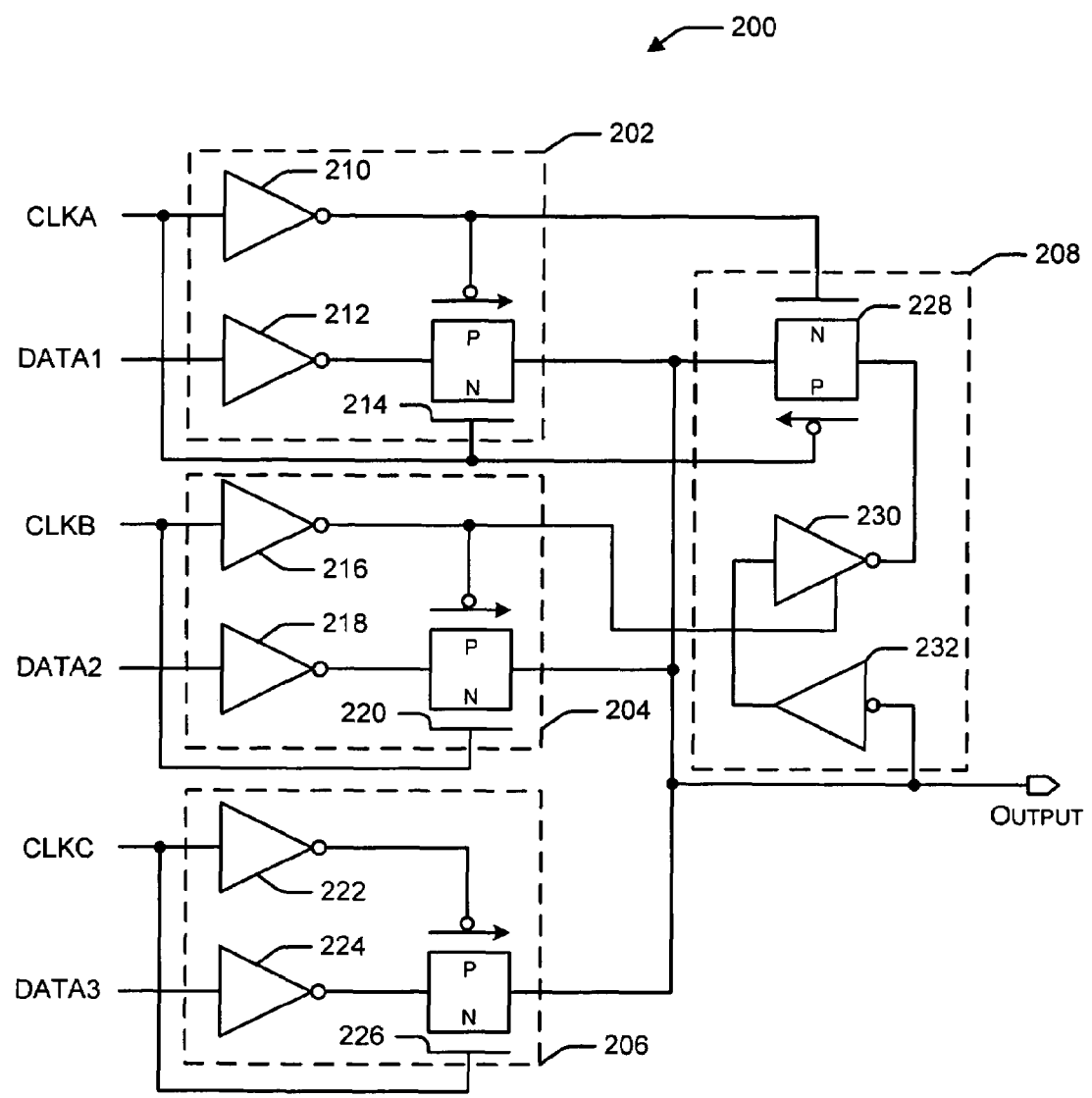
FIG. 2 is a circuit diagram illustrating an implementation of partially gated mux-latch circuit.

FIG. 2 illustrates an implementation of a partially gated mux-latch 200 in a 3-1 format. The mux-latch 200 includes three data and clock sections, or forward path sections 202, 204 and 206. The mux-latch 200 further includes a keeper 208 that is implemented without the use of long channel devices. Eliminating the use of long channel devices in the keeper 208 reduces the power consumption of the mux-latch 200. This allows the mux-latch 200 to be used in low voltage devices.

The section 202 includes two inverters 210 and 212. The inverter 210 receives an input clock signal CLKA and the inverter 212 receives a data signal DATA1. The section 202 further includes a passgate 214. The passgate 214 is comprised of a p-device in parallel with an n-device. Therefore, the passgate 214 will be "on", if an output from the inverter 210 is at a logic low level (0). When the passgate 214 is triggered "on" by the output of inverter 210, an output from the inverter 212 is permitted to pass through the passgate 214.

The section 204 includes two inverters 216 and 218. The inverter 216 receives an input clock signal CLKB and the inverter 218 receives a data signal DATA2. The section 204 further includes a passgate 220. The passgate 220 is comprised of a p-device in parallel with an n-device. Therefore, the passgate 220 will be "on", if an output from the inverter 216 is at a logic low level (0). When the passgate 220 is triggered "on" by the output of inverter 216, an output from the inverter 218 is permitted to pass through the passgate 214.

The section 206 includes two inverters 222 and 224. The inverter 222 receives an input clock signal CLKC and the inverter 224 receives a data signal DATA3. The section 206 further includes a passgate 226. The passgate 226 is comprised of a p-device in parallel with an n-device. Therefore, the passgate 226 will be "on", if an output from the inverter 222 is at a logic low level (0). When the passgate 226 is triggered "on" by the output of inverter 222, an output from the inverter 224 is permitted to pass through the passgate 226.

The keeper 208 of the partially gated mux-latch 200 is implemented using components that are not long channel devices. In particular, the components of the keeper 208 may be short channel devices. Implementing the keeper 208 with short channel devices simplifies a process used to generate devices that implement mux-latches.

The keeper 208 maintains its state, regardless of a logic level change associated with an active clock cycle. For example, when the input clock signal CLKA is at a logic high level (1), the data signal DATA1 is inverted and passes through the passgate 214 and is output from the mux-latch 200. The keeper 208 maintains a logic level of the data signal DATA1 even when the input clock signal CLKA transitions to a logic low level (0). The keeper 208 will maintain the logic level of the data signal DATA1 until one of the input clock signals CLKA, CLKB, or CLKC transitions to a logic high level (1).

The keeper 208 includes a passgate 228 that is gated by the input clock signal CLKA. The passgate 228 is in series with a tristate inverter 230. The tristate inverter 230 is enabled when an output of the inverter 216 is at a logic high level (1). The tristate inverter 230 receives, at its input, an output from an inverter 232. The inverter 232 is part of the keeper 208. An output of the tristate inverter 230 passes through the passgate 228 when an n-side thereof is at a logic low level (0) and when a p-side thereof is at a logic high level (1). Each of the components 228, 230 and 232 of the keeper 208 is a short channel device.

Operation of the partially gated mux-latch 200 will now be described. In general, when one of the input clock signals (CLKA, CLKB, or CLKC) is at a logic high level (1), a respective data signal (DATA1, DATA2, or DATA3), after inversion, is permitted to pass through a respective one of the passgates 214, 220, and 226 and is output from the mux-latch 200.

When the input clock signal CLKA is at a logic high level (1), the inverter 210 inverts the clock signal CLKA to a logic low level (0). Therefore, the passgate 214 is "on", since the p-side of the passgate 214 is at a logic low level (0) and the n-side thereof is at a logic high level (1). The passgate 228 of the keeper 208 is "off", since the n-side of the passgate 228 is at a logic low level (0) and the p-side thereof is at a logic high level (1). When the passgate 228 is in the "off" state, the keeper 208 is fully interrupted and the inverted input data signal DATA1 is allowed to pass to the output of the mux-latch 200.

When the input clock signal CLKB is at a logic high level (1), the inverter 216 inverts the clock signal CLKB to a logic low level (0). Therefore, the passgate 220 is "on", since the p-side of the passgate 220 is at a logic low level (0) and the n-side thereof is at a logic high level (1). The tristate inverter 230 of the keeper 208 is enabled when an output of the inverter 216 is at a logic high level (1). Therefore, when the CLKB is at a logic high level (1), the tristate inverter 230 is in an "off" state. Accordingly, the keeper 208 is partially interrupted when the CLKB is at a logic high level (1), which allows the inverted data signal DATA2 to pass to the output of the mux-latch 200.

As is illustrated in FIG. 2, the input clock signal CLKC does not interrupt the keeper 208. However, the tristate inverter 230 in series with the passgate 228 effectively doubles the channel length of the keeper 208. Therefore, when CLKC is at a logic high level (1), the keeper 208 is weakened, just like a conventional keeper implementing long channel devices would be, which allows the inverted data signal DATA3 to pass to the output of the mux-latch 200. Again, it should be clear that the components implemented in the keeper 208 may be short channel device.

As should be appreciated from the foregoing description, the section 202 fully interrupts the keeper 208 when the input clock signal CLKA is at a logic high level (1); the section 204 partially interrupts the keeper 208 when the input clock signal CLKB is at a logic high level (1); and the section 206 does not interrupt the keeper 208.

The partially gated mux-latch 200 may be implemented in 2-1, 4-1, 5-1, 6-1, etc, format as well. If the mux-latch 200 were implemented in 4-1 format, an additional section, similar to the section 206, would be added to the illustrated mux-latch 200. For a 5-1 format, then two additional sections, each similar to the section 206, would be added to the illustrated mux-latch 200. For the 2-1 format, the section 206 would be removed from the illustrated mux-latch 200.

In one implementation of the mux-latch 200, the passgates 214, 220 and 226 are at least three-times larger than the passgate 228 of the keeper 208. In another implementation, just the passgate 226 is at least three-times larger than the passgate 228 of the keeper 208. A larger passgate 226, as compared to the passgate 228, helps weaken the keeper 208 sufficiently to allow the data input signal DATA3 to pass to the output of the mux-latch 200 when the input clock signal CLKC is at a logic high level (1).

Figure 3:
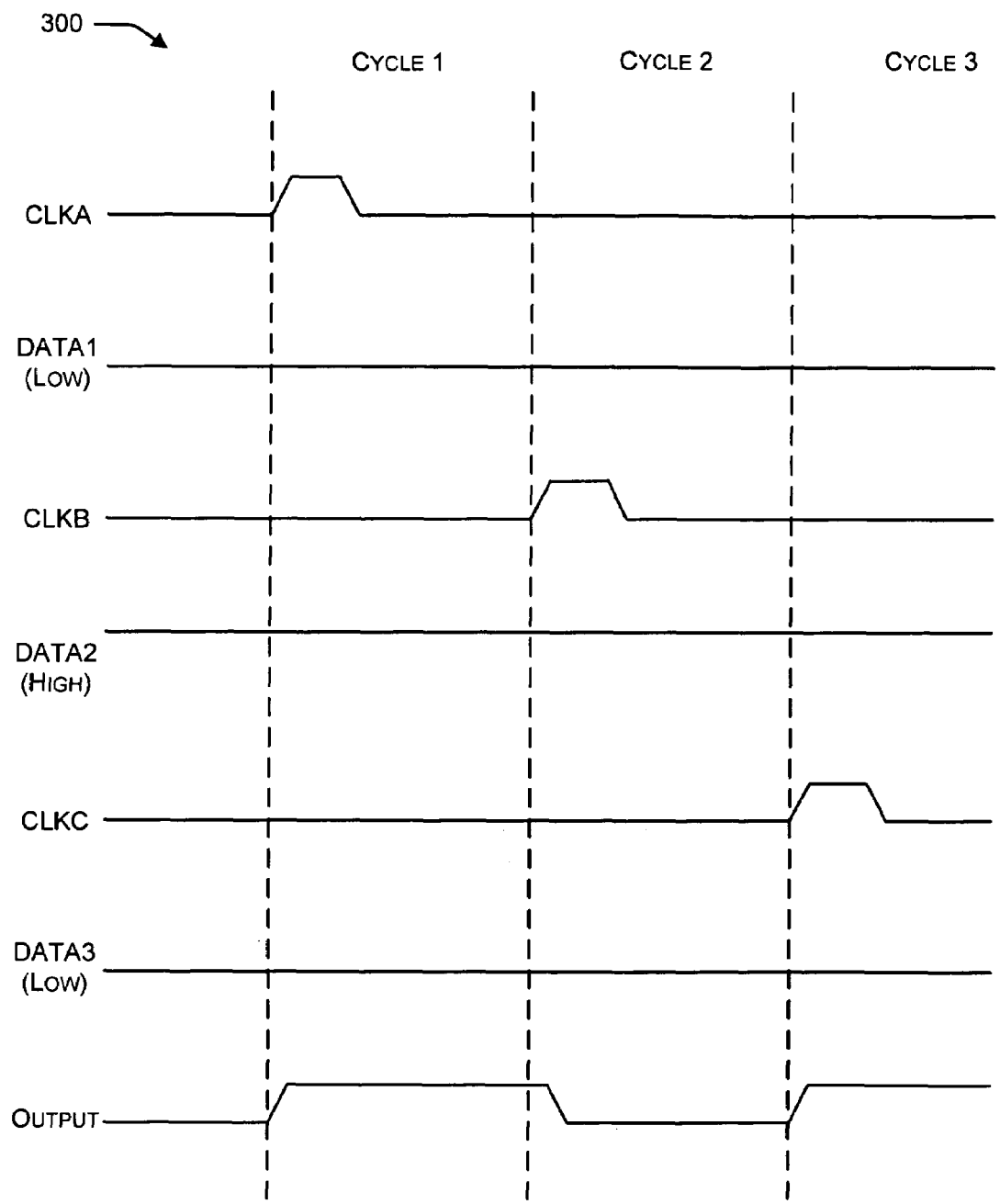
FIG. 3 illustrates a sample timing diagram of one implementation of a partially gated mux-latch.

FIG. 3 illustrates a sample timing diagram 300 of one implementation of a partially gated mux-latch, such as the partially gated mux-latch 200 illustrated in FIG. 2. As is shown in the figure, when the input clock signal CLKA switches to a logic high level (1) at Cycle 1, the data input signal DATA1, which is at a logic low level (0), is inverted by the inverter 212 and is allowed to pass through the passgate 214. The inverted data input signal DATA1 is output from the mux-latch 200 at a logic high level (1). The keeper 208 maintains the output of the mux-latch 200 even when the input clock signal CLKA transitions to a logic low level (0).

At Cycle 2, the input clock signal CLKB switches to a logic high level (1). At this point, the data input signal DATA2, which is at a logic high level (1), is inverted by the inverter 218 and is allowed to pass through the passgate 220. Also, when the input clock signal CLKB switches to a logic high level (1), the tristated inverter 230 is disabled. This partially interrupts the keeper 208. Accordingly, the inverted data input signal DATA2 is output from the mux-latch 200 at a logic low level (0). The keeper 208 maintains the output of the mux-latch 200 even when the input clock signal CLKB transitions to a logic low level (0).

At Cycle 3, the input clock signal CLKC switches to a logic high level (1). The data input signal DATA3, which is at a logic low level (0), is inverted by the inverter 224 and is allowed to pass through the passgate 226. The keeper 208 cannot contend with the enabled passgate 226, so the inverted data input signal DATA3 is output from the mux-latch 200 at a logic high level (1). The keeper 208 maintains the output of the mux-latch 200 even when the input clock signal CLKC transitions to a logic low level (0).

Procedure

The following discussion describes procedures that may be implemented utilizing the previously described mux-latch implementations. Aspects of the procedures may be implemented in hardware, firmware, or software, or a combination thereof. The procedures are shown as a set of blocks that specify operations performed by one or more devices and are not necessarily limited to the order shown for performing the operations by the respective blocks. In portions of the following discussion, reference will be made to the components of FIG. 2.

Figure 4:
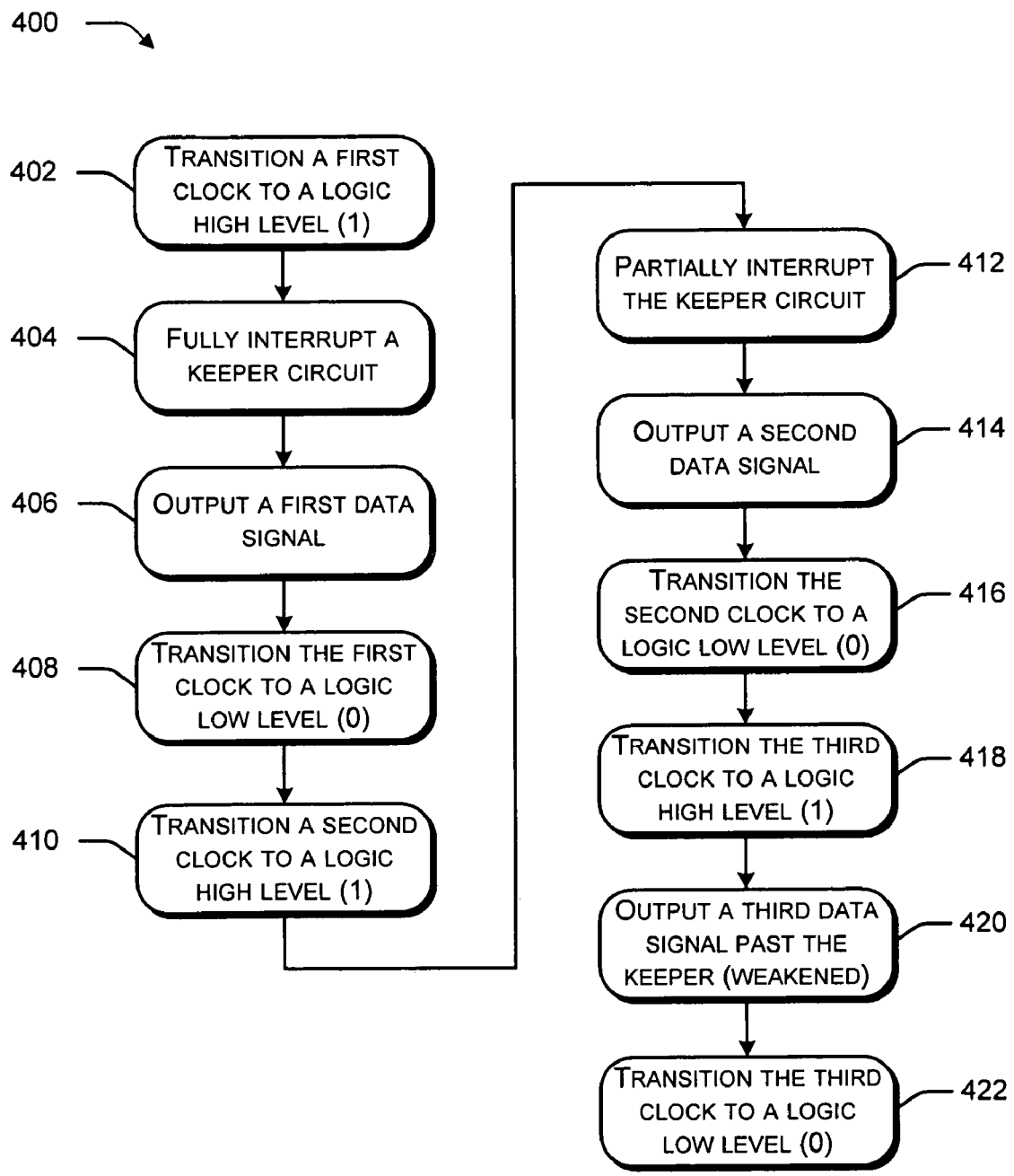
FIG. 4 shows an example procedure that enables output of data from a mux-latch, such as the mux-latch illustrated in FIG. 2.

FIG. 4 shows an example procedure 400 that enables output of data from a mux-latch, such as the mux-latch 200. The mux-latch may be part of a processor, memory, or other IC or device requiring latch control of data signals for intra-device communications.

At block 402 a first clock input to the mux-latch transitions to a logic high level (1). At block 404, the first clock input is inverted and the inverted signal fully interrupts a keeper circuit of the mux-latch. At block 406, as a result of the first clock, a first data signal is output from the mux-latch. At block 408, the first clock transitions to a logic low level (0) and the keeper maintains the output of the mux-latch (i.e., the logic level of the first data signal).

At block 410, a second clock input to the mux-latch transitions to a logic high level (1). At block 412, the second clock input is inverted and the inverted signal partially interrupts the keeper circuit of the mux-latch. At block 414, as a result of the second clock, a second data signal is output from the mux-latch. At block 416, the second clock transitions to a logic low level (0) and the keeper maintains the output of the mux-latch (i.e., the logic level of the second data signal).

At block 418, a third clock input to the mux-latch transitions to a logic high level (1). At block 420, at least in part as a result of the third clock, the keeper is weakened and a third data signal is output from the mux-latch. At block 422, the third clock transitions to a logic low level (0) and the keeper maintains the output of the mux-latch (i.e., the logic level of the third data signal).

Exemplary Devices

Figure 5:
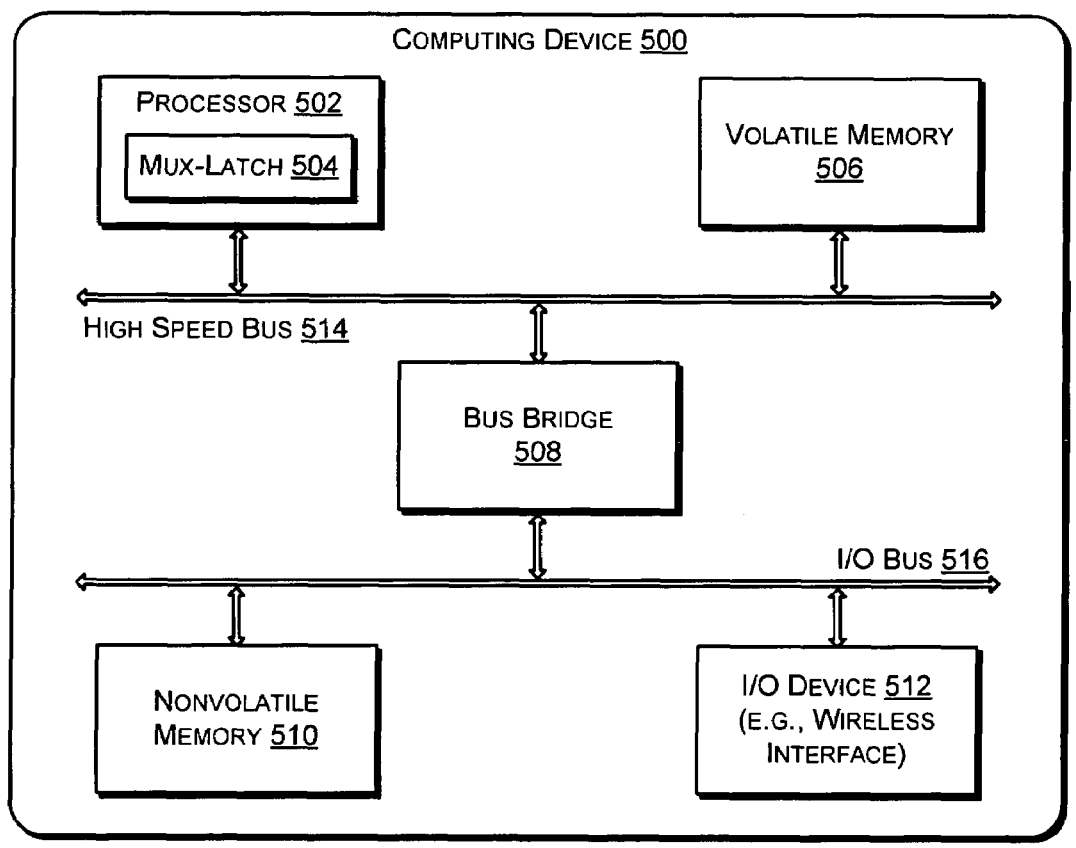
FIG. 5 illustrates an exemplary implementation of a computing device that is operable to employ one or more mux-latches.

FIG. 5 illustrates an exemplary implementation of a computing device 500 that is operable to employ one or more mux-latches, such as the mux-latch 200 and related procedures described herein. The computing device 500 may be configured in a variety of ways. For example, the computing device 500 may be configured as a personal computer, a notebook computer, a wireless phone, a server, a wireless base station, as local area network (LAN) equipment, a network access device (e.g., a broadband access device), a personal digital assistant (PDA), and so on.

The computing device 500 is illustrated as including various components. These components include, but are not limited as such, a processor 502 that implements at least one mux-latch 504, a volatile memory 506, a bus bridge 508, a nonvolatile memory 510 and an input/output (I/O) device 512. The components are coupled together by a high speed bus 514 and an I/O bus 516.

The mux-latch 504 included in the processor 502 may be similar to or the same as the mux-latch 200 described herein. The mux-latch 504 may employ a keeper circuit that is implemented without the use of long channel devices. More specifically, the keeper circuit may employ devices that have the same channel length, or substantially the same channel length, as other devices included in the processor 502. Therefore, the keeper circuit of the mux-latch 504 may be implemented with the same minimum sized transistors (short channel devices) used by the processor 502. Doing so may enhance the operation of the processor 502 by reducing the area overhead of the keeper circuit and may simplify a process used to generate the processor 502.

The keeper circuit employed by the mux-latch 504 may be similar to or the same as the keeper 208 described herein. As those skilled in the art appreciate, the mux-latch 504 may be employed in other ICs other than the processor 502 shown in the figure. Such other ICs include memories, buffers, amplifiers, receivers, transceivers, and intelligent switches

CONCLUSION

Although the subject matter has been described in language specific to structural features and/or methodological acts, it is to be understood that the subject matter defined in the appended claims is not necessarily limited to the specific features or acts described. Rather, the specific features and acts are disclosed as example forms of implementing the claims.

What is claimed is:

1. A multiplexer latch, comprising:
a first forward path section and a second forward path section; and
a keeper that is fully interruptible by the first forward path section and is partially interruptible by the second forward path section.

2. The multiplexer latch according to claim 1, wherein a clock signal of the first forward path fully interrupts the keeper.

3. The multiplexer latch according to claim 1, wherein a clock signal of the second forward path partially interrupts the keeper.

4. The multiplexer latch according to claim 1, wherein the keeper comprises a passgate used to fully interrupt the keeper.

5. The multiplexer latch according to claim 1, wherein the keeper comprises a passgate, the passgate gated to an "off" state when a clock signal of the first forward path section is at a logic high level (1).

6. The multiplexer latch according to claim 1, wherein the keeper comprises a tristate inverter used to partially interrupt the keeper.

7. The multiplexer latch according to claim 1, wherein the keeper comprises a tristate inverter, the tristate inverter is disabled when a clock signal of the second forward path section is at a logic high level (1).

8. The multiplexer latch according to claim 1, wherein the keeper comprises a passgate and a tristate inverter, an output of the tristate inverter coupled to an input of the passgate.

9. The multiplexer latch according to claim 1, wherein the keeper comprises at least a passgate in series with a tristate inverter.

10. The multiplexer latch according to claim 1, wherein the keeper consists of an inverter coupled to an input of a tristate inverter, and a passgate having an input coupled to an output of the tristate inverter.

11. The multiplexer latch according to claim 1, wherein the keeper is not implemented with long channel devices.

12. The multiplexer latch according to claim 1, wherein the first forward path section includes a passgate and the keeper includes another passgate, the passgate at least three-times larger than the another passgate of the keeper.

13. A method, comprising:
fully interrupting a keeper circuit when a logic level of a first clock transitions;
outputting a first data signal when the logic level of the first clock transitions; and
partially interrupting the keeper circuit when a second clock signal is at a logic high level (1).

14. The method according to claim 13, further comprising partially interrupting the keeper circuit when a logic level of a second clock transitions.

15. The method according to claim 14, further comprising outputting a second data signal when the logic level of the second clock transitions.

16. The method according to claim 13, wherein the keeper circuit is fully interrupted when the first clock signal is at a logic high level (1).

17. The method according to claim 13, wherein fully interrupting the keeper includes disabling a passgate of the keeper circuit.

18. The method according to claim 14, wherein partially interrupting the keeper circuit includes disabling a tristate inverter of the keeper circuit.

* * * * *